(12) United States Patent
Nam et al.

(10) Patent No.: US 12,538,528 B2
(45) Date of Patent: Jan. 27, 2026

(54) SEMICONDUCTOR ELEMENT AND MULTIPLEXER INCLUDING A PLURALITY OF SEMICONDUCTOR ELEMENTS

(71) Applicant: Samsung Electronics Co., Ltd., Suwon-si (KR)

(72) Inventors: Seunggeol Nam, Suwon-si (KR); Hagyoul Bae, Suwon-si (KR); Jinseong Heo, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 599 days.

(21) Appl. No.: 17/983,856

(22) Filed: Nov. 9, 2022

(65) Prior Publication Data

US 2023/0141173 A1 May 11, 2023

(30) Foreign Application Priority Data

Nov. 10, 2021 (KR) .................. 10-2021-0154289

(51) Int. Cl.
| | | |
|---|---|---|
| *H01L 29/78* | (2006.01) | |
| *H01L 27/118* | (2006.01) | |
| *H01L 29/423* | (2006.01) | |
| *H01L 29/49* | (2006.01) | |
| *H01L 29/786* | (2006.01) | |
| *H10D 30/67* | (2025.01) | |
| *H10D 30/69* | (2025.01) | |
| *H10D 84/90* | (2025.01) | |

(52) U.S. Cl.
CPC ....... *H10D 30/701* (2025.01); *H10D 30/6733* (2025.01); *H10D 30/6735* (2025.01); *H10D 30/6739* (2025.01); *H10D 30/6757* (2025.01); *H10D 84/907* (2025.01); *H10D 84/938* (2025.01)

(58) Field of Classification Search
CPC ............ H10D 30/701; H10D 30/6733; H10D 30/6735; H10D 30/6739; H10D 30/6757; H10D 84/907; H10D 84/938; H10D 64/689; H10B 51/30; G11C 11/221
USPC ...................................................... 257/203
See application file for complete search history.

(56) References Cited

U.S. PATENT DOCUMENTS 8,274,098 B2 9/2012 Chung et al.
8,772,877 B2 7/2014 Bjoerk et al.
(Continued)

FOREIGN PATENT DOCUMENTS

KR 101443215 B1 9/2014

*Primary Examiner* — Tong-Ho Kim
(74) *Attorney, Agent, or Firm* — Harness, Dickey & Pierce P.L.C.

(57) ABSTRACT

According to various example embodiments, a semiconductor element includes: a channel layer including a semiconductor material; a p-type semiconductor layer and an n-type semiconductor layer apart from each other with the channel layer therebetween, a paraelectric layer on a first area of the channel layer, a ferroelectric layer on a second area different from the first area of the channel area, and having a polarization state due to a voltage applied from an external source, a first gate electrode on the paraelectric layer, a second gate electrode on the ferroelectric layer, and an insulating layer between the first gate electrode and the second gate electrode, and electrically separating the first gate electrode and the second gate electrode from each other.

23 Claims, 7 Drawing Sheets

(56) References Cited

U.S. PATENT DOCUMENTS

| | | | |
|---|---|---|---|
| 10,840,253 B2 | 11/2020 | Tan et al. | |
| 2007/0252212 A1* | 11/2007 | Onsongo | H10D 12/021 |
| | | | 257/355 |
| 2008/0312088 A1* | 12/2008 | Chung | H10D 62/8603 |
| | | | 257/29 |
| 2009/0057737 A1 | 3/2009 | Boescke et al. | |
| 2013/0021061 A1* | 1/2013 | Bjoerk | H10D 12/211 |
| | | | 257/E29.264 |
| 2017/0162250 A1 | 6/2017 | Slesazeck et al. | |
| 2020/0099379 A1 | 3/2020 | Sharma et al. | |
| 2020/0235221 A1* | 7/2020 | Sharma | H10D 84/017 |

* cited by examiner

| $S_0$ | $S_1$ | Out |
|---|---|---|
| 0 | 0 | A |
| 0 | 1 | B |
| 1 | 0 | C |
| 1 | 1 | D |

SEMICONDUCTOR ELEMENT AND MULTIPLEXER INCLUDING A PLURALITY OF SEMICONDUCTOR ELEMENTS

CROSS-REFERENCE TO RELATED APPLICATION

This application is based on and claims priority under 35 U.S.C. § 119 to Korean Patent Application No. 10-2021-0154289, filed on Nov. 10, 2021, in the Korean Intellectual Property Office, the disclosure of which is incorporated by reference herein in its entirety.

BACKGROUND

Various example embodiments relate to a semiconductor element and/or a multiplexer including a plurality of semiconductor elements.

A multiplexer (MUX), which is or includes a logic circuit for selecting one of a plurality of inputs and exporting the selected input as an output, has been used in various electronic apparatuses. The MUX includes a control input terminal configured to determine which input is exported as or enabled as an output, in addition to an input terminal and an output terminal. A memory cell storing bit information may be connected to the input terminal of the MUX, and the bit information of the memory cell may be selectively exported as an output in response to a control input applied to the control input terminal.

For example, a static random access memory (SRAM) cell storing bit information may be connected to the input terminal of the MUX that includes a plurality of complementary metal-oxide-semiconductor (CMOS) transistors. In this case, one of a plurality of inputs stored in the SRAM cell may be exported as an output according to a control input applied to the control input terminal of the multiplexer including the plurality of CMOS transistors.

However, because the SRAM cell is a volatile memory element storing information only when power is supplied thereto, the power consumption thereof may be large compared to that of a non-volatile memory element. Alternatively or additionally, a signal delay may occur between the SRAM cell and the multiplexer including the plurality of CMOS transistors, thus reducing a data processing rate.

SUMMARY

Provided is a multiplexer including a semiconductor element having a ferroelectric layer with a polarization state, the multiplexer thus exhibiting an improved data processing rate and being reconfigurable as various logic circuits.

Alternatively or additionally, provided is a multiplexer having a structure in which a memory element including bit information and a control input terminal configured to receive a control input from the outside are embedded by including a ferroelectric layer having a polarization state and a semiconductor having a PIN structure, and accordingly, the multiplexer may be miniaturized.

Additional aspects will be set forth in part in the description which follows and, in part, will be apparent from the description, and/or may be learned by practice of variously described example embodiments.

According to an aspect of an embodiment, a semiconductor element includes a channel layer including a semiconductor material, a p-type semiconductor layer, and an n-type semiconductor layer, which are apart from each other with the channel layer between the p-type semiconductor layer and the n-type semiconductor layer, a paraelectric layer on a first area of the channel layer, a ferroelectric layer on a second area different from the first area of the channel area, and configured to have a polarization state due to a voltage applied from an external source, a first gate electrode on the paraelectric layer, a second gate electrode provided on the ferroelectric layer, and an insulating layer which between the first gate electrode and the second gate electrode, and electrically separating the first gate electrode and the second gate electrode from each other.

The first area may include an area relatively closer to the p-type semiconductor layer with respect to a center of the channel area, and the second area may include an area relatively closer to the n-type semiconductor layer with respect to the center of the channel layer.

The channel layer may include an intrinsic semiconductor material.

The polarization state may be up-polarization or down-polarization.

The semiconductor element may further include a drain electrode configured to be electrically connected to the p-type semiconductor layer, and a source electrode configured to be electrically connected to the n-type semiconductor layer.

The ferroelectric layer may include a material in which at least one of an oxide including at least one of hafnium (Hf) and zirconium (Zr) or an oxide including any one from among Hf and Zr is doped with at least one impurity from among silicon (Si), aluminum (Al), yttrium (Y), lanthanum (La), gadolinium (Gd), strontium (Sr), Hf, cerium (Ce), and Zr.

The paraelectric layer may include at least one of a silicon oxide, a silicon nitride, a silicon oxynitride, a metal oxide, a metal oxynitride, and a silicate.

The semiconductor element may further include a second paraelectric layer between the ferroelectric layer and the channel layer.

The paraelectric layer and the ferroelectric layer may each have an all-around shape surrounding the channel layer.

The first gate electrode and the second gate electrode may each have an all-around shape surrounding the channel layer.

The semiconductor element may further include a substrate below the p-type semiconductor layer, the channel layer, and the n-type semiconductor layer.

The semiconductor element may further include a second insulating layer between the substrate and the p-type semiconductor layer, the channel layer, and the n-type semiconductor layer.

Each of the first gate electrode and the second gate electrode may include at least one of a metal, a metal nitride, a polysilicon, and a two-dimensional material.

The channel layer may include at least one of Si, germanium (Ge), Group III-V semiconductor, oxide semiconductor, nitride semiconductor, nitrogen oxide semiconductor, and a two-dimensional material.

According to various example embodiments, a multiplexer includes a plurality of semiconductor elements connected in parallel to each other.

Each of the plurality of semiconductor elements includes a channel layer including a semiconductor material, a p-type semiconductor layer, and a n-type semiconductor layer apart from each other with the channel layer between the p-type semiconductor layer and the n-type semiconductor layer, a paraelectric layer on a first area of the channel area, a ferroelectric layer on a second area that is different from the first area of the channel area, and configured to have a polarization state according to a voltage applied from an outside, a first gate electrode on the paraelectric layer, a second gate electrode on the ferroelectric layer, and an insulating layer between the first gate electrode and the second gate electrode, and electrically separating the first gate electrode and the second gate electrode from each other.

The p-type semiconductor layers respectively included in the plurality of semiconductor elements may be configured to operate as a plurality of first input terminals of the multiplexer.

The first gate electrodes respectively included in the plurality of semiconductor elements may be configured to operate as a plurality of second input terminals of the multiplexer.

The n-type semiconductor layers respectively included in the plurality of semiconductor elements may be connected in parallel to each other, and may be configured to operate as a single output terminal of the multiplexer.

Polarization states of ferroelectric layers of at least two of the plurality of semiconductor elements may be up polarization and down polarization, which are different from each other.

The multiplexer may further include at least one inverter connected to at least one of the plurality of semiconductor elements.

In response to a first input voltage and a second input voltage being respectively applied to the p-type semiconductor and first gate electrode included in each of the plurality of semiconductor elements, an arrangement of the at least one inverter and polarization states of ferroelectric layers respectively included in the plurality of semiconductor elements may be determined so that the multiplexer operates as any of an AND gate, an OR gate, a NAND gate, and a NOR gate.

The plurality of semiconductor elements may include four semiconductor elements of a first semiconductor element, a second semiconductor element, a third semiconductor element, and a fourth semiconductor element, which are connected in parallel to each other.

A p-type semiconductor layer and first gate electrode of the first semiconductor element may be connected to the at least one inverter.

In response to a p-type semiconductor layer of the second semiconductor element being connected to the at least one inverter, a first gate electrode of the second semiconductor layer may be not connected to the at least one inverter.

In response to a p-type semiconductor layer of the third semiconductor element not being connected to the at least one inverter, a first gate electrode of the third semiconductor layer may be connected to the at least one inverter.

A p-type semiconductor layer and first gate electrode of the fourth semiconductor element may be connected to the at least one inverter.

A polarization state of a first ferroelectric layer included in the first semiconductor element may be down-polarization, and polarization states of the second to fourth ferroelectric layers respectively included in the second to fourth semiconductor elements may be up-polarization.

Polarization states of first to third ferroelectric layers respectively included in the first to third semiconductor elements may be up-polarization, and a polarization state of a fourth ferroelectric layer included in the fourth semiconductor element may be down-polarization.

A polarization state of a first ferroelectric layer included in the first semiconductor element may be up-polarization, and polarization states of the second to fourth ferroelectric layers respectively included in the second to fourth semiconductor elements may be down-polarization.

Polarization states of first to third ferroelectric layers respectively included in the first to third semiconductor elements may be down-polarization, and a polarization state of a fourth ferroelectric layer included in the fourth semiconductor element may be up-polarization.

According to various example embodiments, a semiconductor element may include an intrinsic layer, a first semiconductor layer of a first conductivity type and a second semiconductor layer of a second conductivity type, which are apart from each other, with the intrinsic layer between the first semiconductor layer and the second semiconductor layer, a paraelectric layer on an first area of the intrinsic layer that is adjacent to the first semiconductor layer, a ferroelectric layer on a second area of the intrinsic layer that is adjacent to the second semiconductor layer, and configured to have a polarization state in response to a voltage applied from an external source, a first gate electrode on the paraelectric layer, a second gate electrode on the ferroelectric layer, and an insulating layer between the first gate electrode and the second gate electrode, and electrically separating the first gate electrode and the second gate electrode from each other.

The insulating layer may be over a boundary line between the first semiconductor layer and the second semiconductor layer.

The first semiconductor layer includes boron, and the second semiconductor layer includes at least one of arsenic or phosphorus.

A concentration of impurities in the first semiconductor layer is greater than a concentration of impurities in the intrinsic layer.

An electronic system may include a semiconductor chip, wherein the semiconductor chip includes the semiconductor element.

BRIEF DESCRIPTION OF THE DRAWINGS

The above and other aspects, features, and advantages of various example embodiments will be more apparent from the following description taken in conjunction with the accompanying drawings, in which.

DETAILED DESCRIPTION

Figure 1:
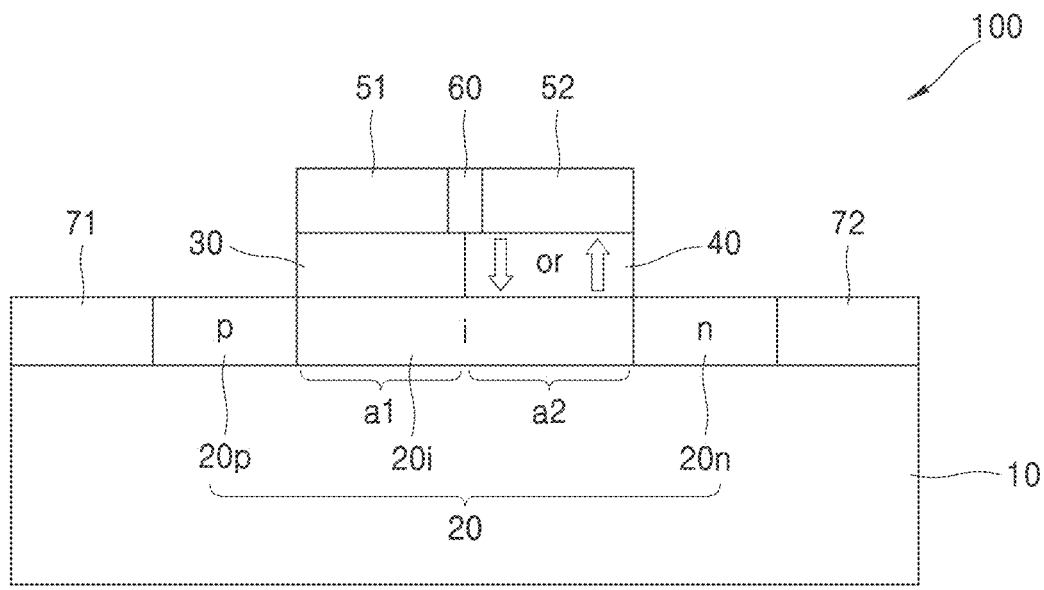
FIG. 1 is a view schematically illustrating an example structure of a semiconductor element according to various example embodiments.

Reference will now be made in detail to various embodiments, examples of which are illustrated in the accompanying drawings, wherein like reference numerals refer to like elements throughout. In this regard, example embodiments have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the sizes of elements may be exaggerated for clarity of illustration.

Although the terms "first", "second", etc., may be used herein to describe various elements, components, regions, and/or layers, these elements, components, regions, and/or layers should not be limited by these terms. These terms are only used to distinguish one element from other elements.

It will be further understood that the terms "comprises" and/or "comprising" used herein specify the presence of stated features or elements, but do not preclude the presence or addition of one or more other features or elements.

Figure 2:
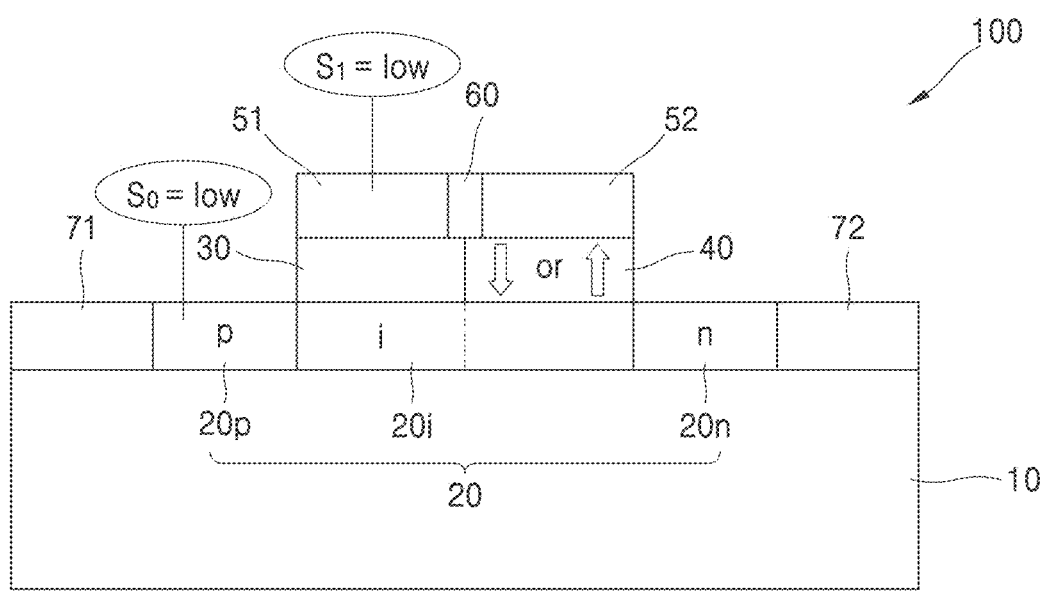
FIG. 2 is a view illustrating a state in which a first control input is applied to the semiconductor element of FIG. 1.
Figure 3:
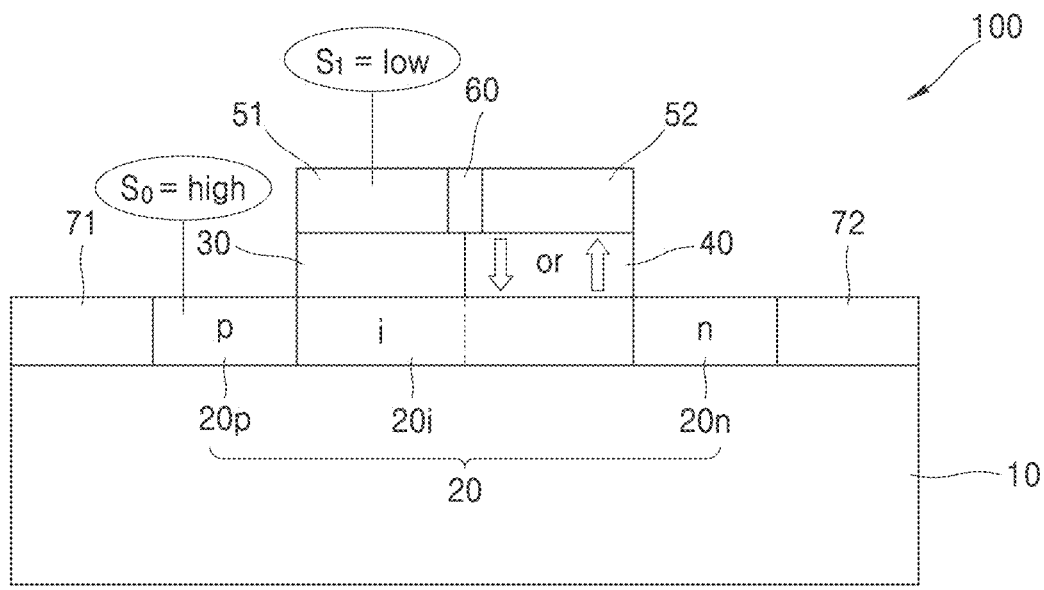
FIG. 3 is a view illustrating a state in which a second control input is applied to the semiconductor element of FIG. 1.
Figure 4:
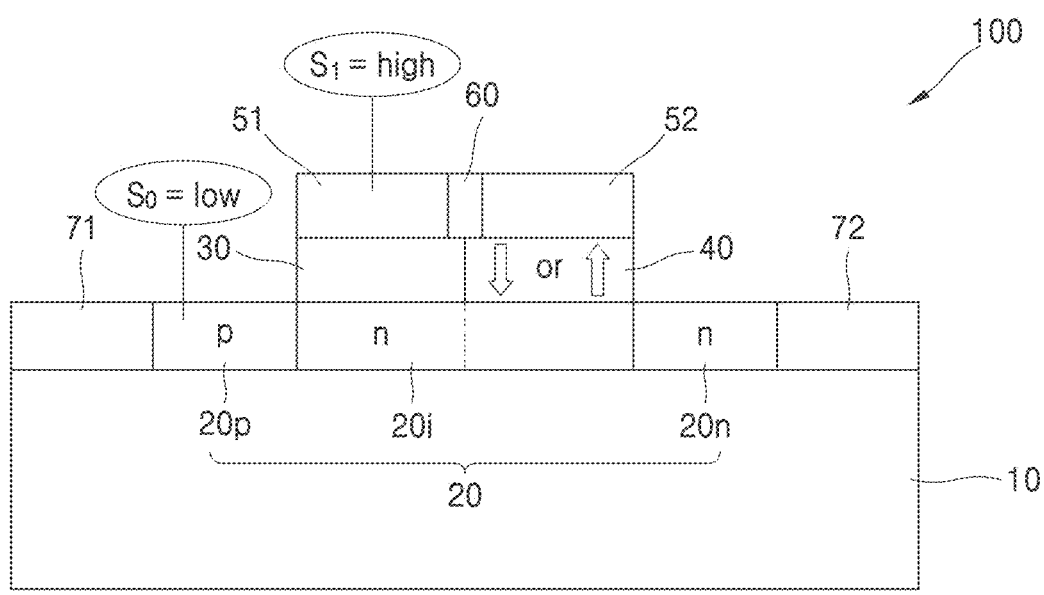
FIG. 4 is a view illustrating a state in which a third control input is applied to the semiconductor element of FIG. 1.
Figure 5:
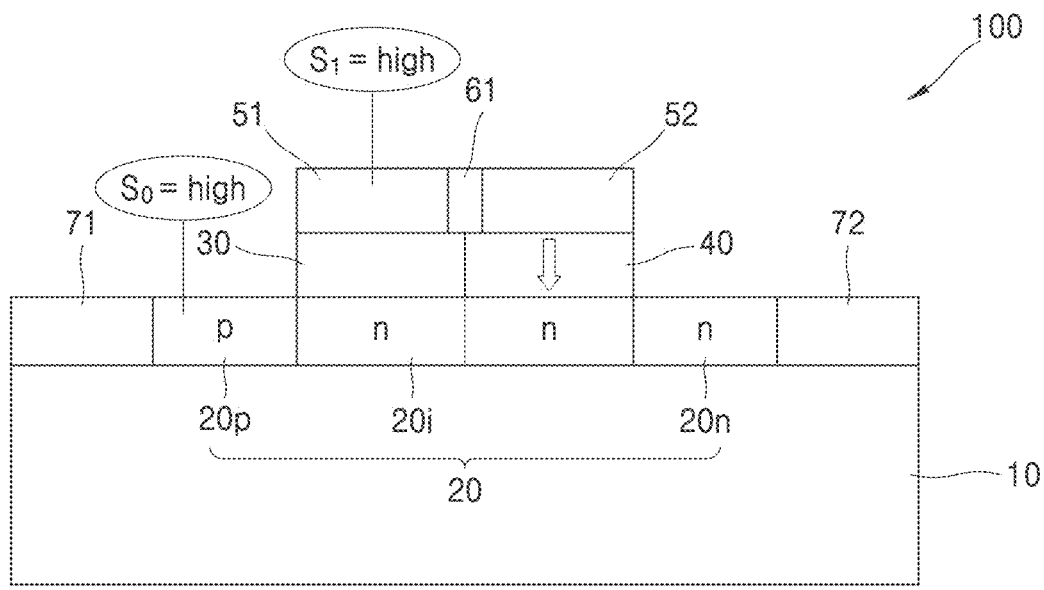
FIG. 5 is a view illustrating a state in which a fourth control input is applied to the semiconductor element of FIG. 1, and a ferroelectric layer that has a first polarization state.
Figure 6:
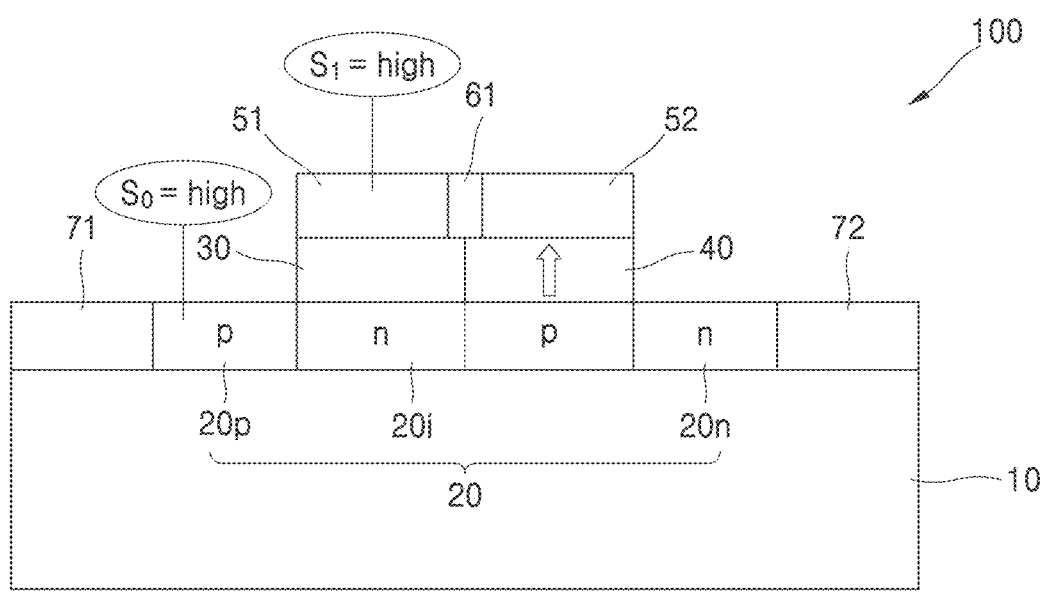
FIG. 6 is a view illustrating a state in which a fourth control input is applied to the semiconductor element of FIG. 1, and a ferroelectric layer that has a second polarization state.

FIG. 1 is a view briefly illustrating an example structure of a semiconductor element 100 according to various example embodiments. FIG. 2 is a view illustrating a state in which a first control input is applied to the semiconductor element 100 of FIG. 1. FIG. 3 is a view illustrating a state in which a second control input is applied to the semiconductor element 100 of FIG. 1. FIG. 4 is a view illustrating a state in which a third control input is applied to the semiconductor element 100 of FIG. 1. FIG. 5 is a view illustrating a state in which a fourth control input is applied to the semiconductor element 100 of FIG. 1, and a ferroelectric layer 40 that has a first polarization state. FIG. 6 is a view illustrating a state in which a fourth control input is applied to the semiconductor element 100 of FIG. 1, and a ferroelectric layer 40 that has a second polarization state.

Referring to FIG. 1, the semiconductor element 100 may include a P-type-intrinsic-N-type (PIN) structure layer 20, a paraelectric layer 30 and the ferroelectric layer 40 provided on the PIN structure layer 20, a first gate electrode 51 provided on the paraelectric layer 30, a second gate electrode 52 provided on the ferroelectric layer 40, and an insulating layer 60 provided between the first gate electrode 51 and the second gate electrode 52. In addition, the semiconductor element 100 may further include a drain electrode 71 formed to be electrically connected to a p-type semiconductor layer 20$p$, and a source electrode 72 formed to be electrically connected to an n-type semiconductor layer 20$n$.

Further, the semiconductor element 100 may include a substrate 10 on which the PIN structure layer 20, the drain electrode 71, and the source electrode 72 are provided. The substrate 10 may be or may include a material such as glass and/or silicon. However, example embodiments are not limited thereto, and the substrate 10 may include a support substrate of various types, other than glass and silicon.

The PIN structure layer 20 may include a channel layer 20$i$ including a semiconductor material, and the p-type semiconductor layer 20$p$ and the n-type semiconductor layer 20$n$ provided to be apart from each other with the channel layer 20$i$ therebetween.

The channel layer 20$i$ may be or may include an intrinsic semiconductor material. The channel layer 20$i$ may be doped, e.g., may be lightly doped with impurities; however, example embodiments are not limited thereto. For example, the channel layer 20$i$ may not be doped with impurities. For example, the channel layer 20$i$ may include any of silicon (Si), germanium (Ge), Group III-V semiconductor, oxide semiconductor, nitride semiconductor, nitrate semiconductor, and a two-dimensional material.

For example, the channel layer 20$i$ may include at least one element selected from among gallium (Ga), tin (Sn), zinc (Zn), aluminum (Al), magnesium (Mg), hafnium (Hf), and lanthanoid. For example, the channel layer 20$i$ may include at least one of an In—Sn—Ga—Zn—O-based material, which is a quaternary metal oxide, an In—Ga—Zn—O-based material, an In—Sn—Zn—O-based material, an In—Sn—Ga—O-based material, an In—Al—Zn—O-based material, a Sn—Ga—Zn—O-based material, an Al—Ga—Zn-0-based material, a Sn—Al—Zn—O-based material, an In—Hf—Zn—O-based material, an In—La—Zn—O-based material, an In—Ce—Zn—O-based material, an In—Pr—Zn—O-based material, an In—Nb—Zn—O-based material, an In—Pm—Zn—O-based material, an In—Sm—Zn—O-based material, an In—Eu—Zn—O-based material, an In—Gd—Zn—O-based material, an In—Er—Zn—O-based material, an In—Tm—Zn—O-based material, an In—Yb—Zn—O-based material, and an In—Lu—Zn—O-based material, which are ternary metal oxides, an In—Sn—O-based material, an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material, which are binary metal oxides, and an In—O-based material, a Sn—O-based material, and a Zn—O-based material, which are primary metal oxides.

However, example embodiments are not limited thereto, and the channel layer 20$i$ may include an intrinsic semiconductor material of various types, other than the materials listed above.

The p-type semiconductor layer 20$p$ may include a semiconductor material doped with p-type impurities. A concentration of p-type impurities in the p-type semiconductor layer 20$p$ may be greater than, e.g. several orders of magnitude greater than, a concentration of either n-type or p-type impurities included in the channel layer 20$i$. For example, the p-type semiconductor layer 20$p$ may include a material in which any of Si, Ge, Group III-V semiconductor, oxide semiconductor, nitride semiconductor, nitrate semiconductor, and a two-dimensional material is doped with p-type impurities including phosphorus (P), arsenic (As), antimony (Sb), or the like. However, example embodiments are not limited thereto, and the p-type semiconductor layer 20$p$ may include a semiconductor material doped with impurities such as p-type impurities of various types, other than the materials listed above.

The n-type semiconductor layer 20n may include a semiconductor material doped with n-type impurities. A concentration of p-type impurities in the n-type semiconductor layer 20n may be greater than, e.g. several orders of magnitude greater than, a concentration of either n-type or p-type impurities included in the channel layer 20i. For example, the n-type semiconductor layer 20n may include a material in which any of Si, Ge, Group III-V semiconductor, oxide semiconductor, nitride semiconductor, nitrate semiconductor, and a two-dimensional material is doped with n-type impurities including boron (B), Al, Ga, or the like. However, example embodiments are not limited thereto, and the n-type semiconductor layer 20n may include a semiconductor material doped with impurities such as n-type impurities of various types, other than the materials listed above. A conductivity type of the p-type semiconductor layer 20p may be different than, e.g. opposite to, a conductivity type of the n-type semiconductor layer 20n. The intrinsic layer 20i may not have a conductivity type.

The p-type semiconductor layer 20p and the n-type semiconductor layer 20n may be respectively provided at opposite ends of or adjacent with the channel layer 20i. For example, the p-type semiconductor layer 20p including a semiconductor material doped with p-type impurities such as boron, the channel layer 20i including an intrinsic semiconductor material, and the n-type semiconductor layer 20n including a semiconductor material doped with n-type impurities such as arsenic and/or phosphorus may be sequentially provided side by side on the same plane. As described above, the PIN structure layer 20, in which the p-type semiconductor layer 20p, the channel layer 20i, and the n-type semiconductor layer 20n are provided side by side, may operate as a PIN diode.

The paraelectric layer 30 and the ferroelectric layer 40 may be provided on the channel layer 20i. In this case, the paraelectric layer 30 may be provided in a first area a1 of the channel layer 20i, and the ferroelectric layer 40 may be provided in a second area a2 of the channel layer 20i. The first area a1 of the channel layer 20i may include an area relatively close or closer to the p-type semiconductor layer 20p with respect to a center of the channel layer 20i. The second area a2 of the channel layer 20i may include an area relatively close or closer to the n-type semiconductor layer 20n with respect to the center of the channel layer 20i. For example, the first area a1 of the channel layer 20i may be positioned between the p-type semiconductor layer 20p and the second area a2 of the channel layer 20i, and the second area a2 of the channel layer 20i may be positioned between the n-type semiconductor layer 20n and the first area a1 of the channel layer 20i. A surface area of the first area a1 may be the same as, greater than, or less than a surface area of the second area a2.

The paraelectric layer 30 may include a paraelectric material. The paraelectric layer 30 may include at least one of a silicon oxide, a silicon nitride, a silicon oxynitride, a metal oxide, a metal oxynitride, and a silicate. For example, the paraelectric layer 30 may include any of silicon dioxide ($SiO_2$), silicon monoxide (SiO), silicon nitride (SiN), silicon oxynitride (SiON), silicon carbon nitride (SiCN), silicon oxygen carbon nitride (SiOCN), aluminum oxide ($Al_2O_3$), and aluminum oxide ($AlO_x$). In addition, the paraelectric layer 30 may include a material in which any of $SiO_2$, SiO, SiN, SiON, SiCN, SiOCN, $Al_2O_3$, and $AlO_x$ is doped with one or more impurities from among Si, Al, zirconium (Zr), yttrium (Y), lanthanum (La), gadolinium (Gd), strontium (Sr), Hf, and cerium (Ce). However, example embodiments are not limited thereto, and the paraelectric layer 30 may include a paraelectric material of various types, other than the materials listed above.

The ferroelectric layer 40 may include a ferroelectric material. The ferroelectric layer 40 may include a material in which an oxide including at least one of Hf and Zr and/or an oxide including any of Hf and Zr is doped with at least one of impurities of Si, Al, Y, La, Gd, strontium (Sr), Hf, Ce, and Zr. For example, the ferroelectric layer 40 may have a shape of a thin-film including a hafnium oxide ($HfO_2$)-based dielectric material. The thin-film including the $HfO_2$-based dielectric material may have ferroelectricity according to the crystalline phase thereof. In addition, the ferroelectric layer 40 may include a material in which an $HfO_2$-based dielectric material is doped with impurities. The impurities may include at least one of Si, Al, Y, La, Gd, Sr, Hf, Ce, and Zr. However, the impurities are not limited thereto and may include an impurity other than the impurities listed above.

The ferroelectric layer 40 may include, for example, $Hf_xZr_{(1-x)}O$ (0<x<1). However, the ferroelectric layer 40 is not limited thereto and may include at least one selected from the group consisting of hafnium oxide (HfO), zirconium dioxide (ZrO), SiO, aluminum monoxide (AlO), cerium(IV) oxide (CeO), yttrium monoxide (YO), lanthanum aluminate (LaO), and a perovskite compound. Further, the ferroelectric layer 40 may include a material in which at least one of HfO, ZrO, SiO, AlO, CeO, YO, LaO, and a perovskite compound is doped with impurities, such as Si, Al, Y, La, Gd, Sr, Hf, Ce, and Zr. However, the impurities are not limited thereto and may include an impurity of different types other than the impurities listed above.

The ferroelectricity of the ferroelectric layer 40 varies depending on the detailed crystalline phase of a material included in the ferroelectric layer 40. The reason for this may be that a material chemically included in the ferroelectric layer 40 could affect the crystal structure of the ferroelectric layer 40. Therefore, the characteristics of the ferroelectric layer 40 may be finely controlled by adjusting the type and content of an impurity added to the ferroelectric layer 40. The ferroelectric layer 40 may be formed through an atomic layer deposition (ALD) process; however, example embodiments are not limited thereto.

The ferroelectric layer 40 may have a polarization state defined by and/or determined by a voltage; the voltage may be applied or pre-applied or previously applied from the outside. For example, when a positive electrode is applied to the second gate electrode 52 provided on the ferroelectric layer 40, a "down polarization" may be formed on the ferroelectric layer 40 in a direction from top to bottom, for example, a direction from the second gate electrode 52 toward the channel layer 20i. Even when the positive electrode applied to the second gate electrode 52 is removed (e.g. the second gate electrode 52 floats), the ferroelectric layer 40 may still be in the "down polarization" state. On the other hand, when a negative electrode is applied to the second gate electrode 52 provided on the ferroelectric layer 40, an "up polarization" may be formed on the ferroelectric layer 40 in a direction from bottom to top, for example, a direction from the channel layer 20i toward the second gate electrode 52. Even when the negative electrode applied to the second gate electrode 52 is removed (e.g. the second gate electrode 52 floats), the ferroelectric layer 40 may still have a polarization state of up-polarization. As described above, the ferroelectric layer 40 may be formed to have any polarization state among up-polarization and down-polarization according to a type of voltage applied to the second gate electrode 52.

The first gate electrode 51 may be provided on the paraelectric layer 30 provided in the first area a1 of the channel layer 20*i*. Accordingly, the first gate electrode 51 may be provided to correspond to the first area a1 of the channel layer 20*i*, and not to overlap the second area a2 of the channel layer 20*i*.

The second gate electrode 52 may be provided on the ferroelectric layer 40 provided in the second area a2 of the channel layer 20*i*. Accordingly, the second gate electrode 52 may be provided to correspond to the second area a2 of the channel layer 20*i*, and may not to overlap the first area a1 of the channel layer 20*i*.

Each of the first gate electrode 51 and the second gate electrode 52 may be or include a conductive material. Each of the first gate electrode 51 and the second gate electrode 52 may include a metal. For example, each of the first gate electrode 51 and the second gate electrode 52 may include any of or more than one of Al, chrome (Cr), Cu, tantalum (Ta), titanium (Ti), molybdenum (Mo), and tungsten (W). However, the metal is not limited thereto, and the first gate electrode 51 and the second gate electrode 52 may each include a metal of various types, in addition to or other than the materials listed above.

In addition, each of the first gate electrode 51 and the second gate electrode 52 may include a conductive material, such as one or more of a metal nitride, a metal oxide, a polysilicon, and a two-dimensional material. For example, the metal nitride may include one or more of titanium nitride (TiN), tantalum nitride (TaN), or the like, and the metal oxide may include one or more of indium oxide ($In_2O_3$), tin(IV) oxide ($SnO_2$), zinc oxide (ZnO), $In_2O_3$—$SnO_2$ (ITO), $In_2O_3$—ZnO, or the like. However, the conductive material is not limited thereto, and the first gate electrode 51 and the second gate electrode 52 may each include a conductive material of various types, other than the materials listed above.

The insulating layer 60 may be provided between the first gate electrode 51 and the second gate electrode 52. The insulating layer 60 may electrically separate the first gate electrode 51 and the second gate electrode 52 from each other. The insulating layer 60 may be provided on or over a boundary line of the paraelectric layer 30 and the ferroelectric layer 40. Accordingly, the insulating layer 60 may cover not only the boundary line of the paraelectric layer 30 and the ferroelectric layer 40, but also opposite sides of the second gate electrode 52 facing each other.

The insulating layer 60 may include an insulating material, such as a silicon oxide. However, the insulating material is not limited thereto, and the insulating layer 60 may include an insulating material of various types in addition to or other than $SiO_2$.

The drain electrode 71 may be formed to be electrically connected to the p-type semiconductor layer 20*p*. For example, the drain electrode 71 may be formed to be apart from the channel layer 20*i* with the p-type semiconductor layer 20*p* therebetween. In this case, the drain electrode 71 may be formed to be in contact with a side surface of the p-type semiconductor layer 20*p*. In addition, the source electrode 72 may be formed to be electrically connected to the n-type semiconductor layer 20*n*. For example, the source electrode 72 may be formed to be apart from the channel layer 20*i* with the n-type semiconductor layer 20*n* therebetween. In this case, the source electrode 72 may be formed to be in contact with a side surface of the n-type semiconductor layer 20*n*.

An operation of the semiconductor element 100 is described below, with reference to FIGS. 2 to 6. Referring to FIGS. 2 to 6, control inputs $S_0$ and $S_1$ may be respectively and independently applied to the p-type semiconductor layer 20*p* and the first gate electrode 51. For example, control input voltages may be respectively and independently applied to the p-type semiconductor layer 20*p* and the first gate electrode 51.

The control input $S_0$ applied to the p-type semiconductor layer 20*p* may have a high value or a low value. In this case, the high value of the control input $S_0$ applied to the p-type semiconductor layer 20*p* may be a voltage greater than 0 V, and the low value of the control input $S_0$ applied to the p-type semiconductor layer 20*p* may be a voltage of 0 V.

The control input $S_1$ applied to the first gate electrode 51 may have a high value or a low value. In this case, the high value of the control input $S_1$ applied to the first gate electrode 51 may be a voltage greater than 0 V, and the low value of the control input $S_1$ applied to the first gate electrode 51 may be a voltage of 0 V. A high value of the control input $S_0$ may be the same as a high value of the control input $S_1$; however, example embodiments are not limited thereto.

Referring to FIG. 2, when the control input $S_0$ having a low value is applied to the p-type semiconductor layer 20*p*, and the control input $S_1$ having a low value is applied to the first gate electrode 51, the first area a1 of the channel layer 20*i* which includes an intrinsic semiconductor material and corresponds to a lower portion of the first gate electrode 51 may be an "intrinsic area." In this case, the p-type semiconductor layer 20*p*, the channel layer 20*i*, and the n-type semiconductor layer 20*n* may constitute a PIN diode, and because the control input $S_0$ having a low value, for example, a voltage of 0 V, is applied to the p-type semiconductor layer 20*p*, a current does not occur from the p-type semiconductor layer 20*p* to the n-type semiconductor layer 20*n*.

Referring to FIG. 3, when the control input $S_0$ having a high value is applied to the p-type semiconductor layer 20*p*, and the control input $S_1$ having a low value is applied to the first gate electrode 51, the first area a1 of the channel layer 20*i* which includes an intrinsic semiconductor material and corresponds to a lower portion of the first gate electrode 51 may be an "intrinsic area." In this case, the p-type semiconductor layer 20*p*, the channel layer 20*i*, and the n-type semiconductor layer 20*n* may constitute a PIN diode. Although the control input $S_0$ having a high value is applied to the p-type semiconductor layer 20*p*, the p-type semiconductor layer 20*p*, the channel layer 20*i*, and the n-type semiconductor layer 20*n* constitute a PIN diode, in which case the channel layer 20*i* operates as a potentiometer, and thus, a current does not occur from the p-type semiconductor layer 20*p* to the n-type semiconductor layer 20*n*.

Referring to FIG. 4, when the control input $S_0$ having a low value is applied to the p-type semiconductor layer 20*p*, and the control input $S_1$ having a high value is applied to the first gate electrode 51, the first area a1 of the channel layer 20*i* which includes an intrinsic semiconductor material and corresponds to the lower portion of the first gate electrode 51 may be an "n-type area." In this case, the p-type semiconductor layer 20*p* and the first area a1 of the channel layer 20*i* may form a PN junction structure. However, even in this case, the control input $S_0$ having a low value, for example, a voltage of 0 V, is also applied to the p-type semiconductor layer 20*p*, and thus, a current does not occur from the p-type semiconductor layer 20*p* to the n-type semiconductor layer 20*n*.

Referring to FIGS. 5 and 6, when the control input $S_0$ having a high value is applied to the p-type semiconductor layer 20p, and the control input $S_1$ having a high value is applied to the first gate electrode 51, the first area a1 of the channel layer 20i which includes an intrinsic semiconductor material and corresponds to the lower portion of the first gate electrode 51 may be an "n-type area." In this case, the p-type semiconductor layer 20p and the first area a1 of the channel layer 20i may form a PN junction structure. In addition, a forward bias may be applied to the P-N junction structure, which is formed by the p-type semiconductor layer 20p and the channel layer 20i, in response to the control input $S_0$ having a high value applied to the p-type semiconductor layer 20p, that is, a positive voltage. A current may occur or flow or may not occur or flow from the p-type semiconductor layer 20p to the n-type semiconductor layer 20n, depending on a polarization state of the ferroelectric layer 40.

For example, referring to FIG. 5, when the ferroelectric layer 40 has a polarization state of down polarization, the second area a2 of the channel layer 20i adjacent to the ferroelectric layer 40 may be an "n-type area." In this case, because the p-type semiconductor layer 20p, the channel layer 20i, and the n-type semiconductor layer 20n form a PN junction structure, and the control input $S_0$ having a high value, for example, a positive voltage, is applied to the p-type semiconductor layer 20p, a current may occur or flow from the p-type semiconductor layer 20p to the n-type semiconductor layer 20n, similar to a case in which a forward bias is applied to the PN diode.

In contrast, referring to FIG. 6, when the ferroelectric layer 40 has a polarization state of up-polarization, the second area a2 of the channel layer 20i adjacent to the ferroelectric layer 40 may be a "p-type area" by the up-polarization. In this case, because the p-type semiconductor layer 20p, the channel layer 20i, and the n-type semiconductor layer 20n form a reverse PN junction structure, and the control input $S_0$ having a high value, for example, a positive voltage, is applied to the p-type semiconductor layer 20p, a current may not occur or flow from the p-type semiconductor layer 20p to the n-type semiconductor layer 20n, similar to a case in which a reverse bias is applied to the PN diode.

As described above, the control inputs $S_0$ and $S_1$ may be respectively applied to the p-type semiconductor layer 20p and the first gate electrode 51, and a polarization state stored in the ferroelectric layer 40 may be output via the n-type semiconductor layer 20n, only when each of the control inputs $S_0$ and $S_1$ has a high value. For example, in a case in which each of the control inputs $S_0$ and $S_1$ has a high value, a value output via the n-type semiconductor layer 20n is "1" when a polarization state of the ferroelectric layer 40 is down polarization, and "0" when the polarization state of the ferroelectric layer 40 is up-polarization.

Figure 7:
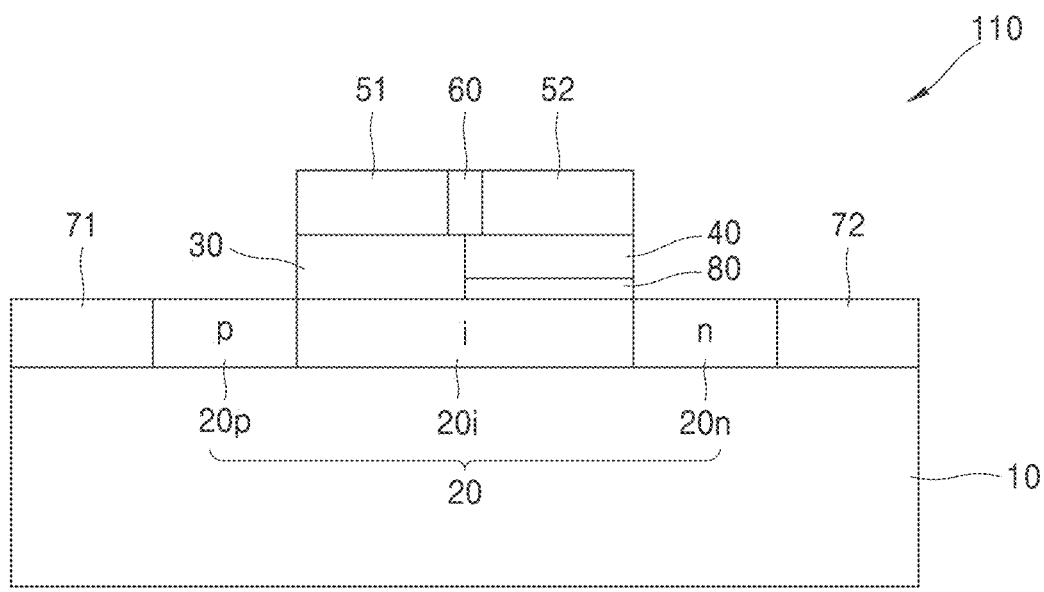
FIG. 7 is a view schematically illustrating an example structure of a semiconductor element according to another embodiment.

FIG. 7 is a view schematically illustrating an example structure of a semiconductor element 110 according to some example embodiment.

The semiconductor element 110 of FIG. 7 may be substantially the same as the semiconductor element 100 of FIG. 1 except that the semiconductor element 110 further includes a second paraelectric layer 80. In the following description with reference to FIG. 7, descriptions that are the same as those given with reference to FIGS. 1 to 6 are not presented.

Referring to FIG. 7, the semiconductor element 110 may further include the second paraelectric layer 80 between the ferroelectric layer 40 and the channel layer 20i. The second paraelectric layer 80 may serve as an insulating layer between the ferroelectric layer 40 and the channel layer 20i.

The second paraelectric layer 80 may include at least one of a silicon oxide, a silicon nitride, a silicon oxynitride, a metal oxide, a metal oxynitride, and a silicate. For example, the second paraelectric layer 80 may include any of $SiO_2$, SiO, SiON, SiCN, SiOCN, $Al_2O_3$, and $AlO_x$. In addition, the paraelectric layer 30 may include a material in which any of $SiO_2$, SiO, SiN, SiON, SiCN, SiOCN, $Al_2O_3$, and $AlO_x$ is doped with one or more impurities from among Si, Al, Zr, Y, La, Gd, Sr, Hf, and Ce. However, the present disclosure is not limited thereto, and the paraelectric layer 30 may include a paraelectric material of various types, other than the materials listed above.

Figure 8:
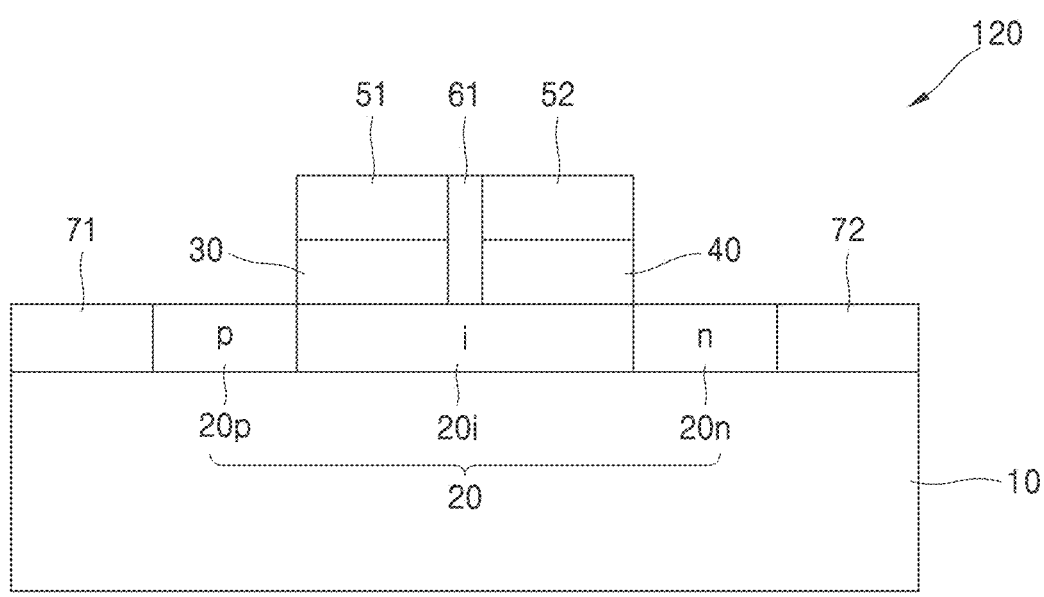
FIG. 8 is a view schematically illustrating an example structure of a semiconductor element according to another embodiment.

FIG. 8 is a view schematically illustrating an example structure of a semiconductor element 120 according to another embodiment.

The semiconductor element 120 of FIG. 8 is substantially the same as the semiconductor element 100 of FIG. 1 except that a structure of an insulating layer 61 of the semiconductor element 120 of FIG. 8 is different from a structure of the insulating layer 60 of the semiconductor element 100 of FIG. 1. In the following description with reference to FIG. 8, descriptions that are the same as those given with reference to FIGS. 1 to 6 are not presented.

Referring to FIG. 8, the insulating layer 61 may be provided between the first gate electrode 51 and the second gate electrode 52. In addition, the insulating layer 61 may be provided between the paraelectric layer 30 and the ferroelectric layer 40. For example, the insulating layer 61 may extend to an area between the paraelectric layer 30 and the first gate electrode 51 from an area between the first gate electrode 51 and the second gate electrode 52. Accordingly, the insulating layer 61 may electrically separate the first gate electrode 51 and the second gate electrode 52 from each other and at the same time, electrically separate the paraelectric layer 30 and the ferroelectric layer 40 from each other. To this end, the insulating layer 61 may be provided to cover both sides of the first gate electrode 51 and the second gate electrode 52 facing each other and to cover both sides of the paraelectric layer 30 and the ferroelectric layer 40 facing each other.

The insulating layer 61 may include an insulating material, such as $SiO_2$. However, the insulating material is not limited thereto, and the insulating layer 61 may include an insulating material of various types other than $SiO_2$.

Figure 9:
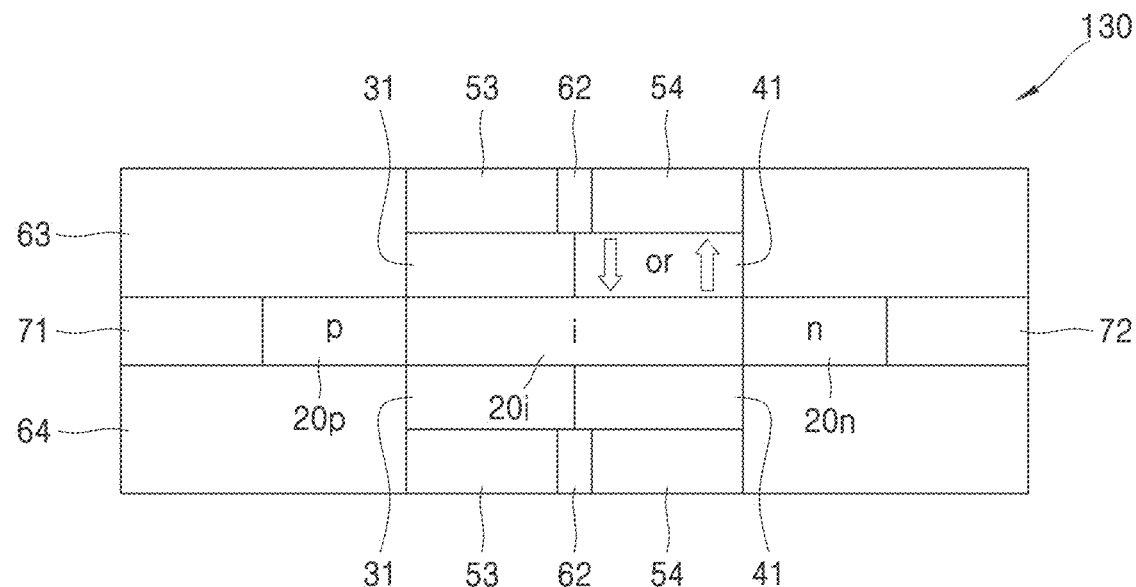
FIG. 9 is a view schematically illustrating an example structure of a semiconductor element according to another embodiment.

FIG. 9 is a view schematically illustrating an example structure of a semiconductor element 130 according to another embodiment.

The semiconductor element 130 of FIG. 9 may be substantially the same as the semiconductor element 100 of FIG. 1 except that a structure of a paraelectric layer 31, a ferroelectric layer 41, a first gate electrode 53, and a second gate electrode 54, and an insulating layer 62 of the semiconductor element 130 of FIG. 9 is different from that of the paraelectric layer 30, the ferroelectric layer 40, the first gate electrode 51, the semiconductor element 130, and the insulating layer 60 of the semiconductor element 100 of FIG. 1. In the following description with reference to FIG. 9, descriptions that are the same as those given with reference to FIGS. 1 to 6 are not presented.

Referring to FIG. 9, the paraelectric layer 31 and the ferroelectric layer 41 may have an all-around shape surrounding the channel layer 20i. For example, the paraelectric layer 31 and the ferroelectric layer 41 may be formed to surround an outer peripheral surface including upper and lower surfaces of the channel layer 20i. In this case, the paraelectric layer 31 may be formed to surround an outer peripheral surface including upper and lower surfaces of the first area a1, and the ferroelectric layer 41 may be formed to surround an outer peripheral surface including upper and lower surfaces of the second area a2.

The paraelectric layer 31 may include at least one of a silicon oxide, a silicon nitride, a silicon oxynitride, a metal oxide, a metal oxynitride, and a silicate. For example, the paraelectric layer 31 may include any of $SiO_2$, SiO, SiN, SiON, SiCN, SiOCN, $Al_2O_3$, and $AlO_x$. In addition, the paraelectric layer 31 may include a material in which any of $SiO_2$, SiO, SiN, SiON, SiCN, SiOCN, $Al_2O_3$, and $AlO_x$ is doped with one or more impurities from among Si, Al, Zr, Y, La, Gd, Sr, Hf, and Ce. However, example embodiments are not limited thereto, and the paraelectric layer 31 may include a paraelectric material of various types, other than the materials listed above.

The ferroelectric layer 41 may include a material in which an oxide including at least one of Hf and Zr or an oxide including any of Hf and Zr is doped with at least one impurity from among Si, Al, Y, La, Gd, strontium (Sr), Hf, Ce, and Zr. For example, the ferroelectric layer 41 may have a shape of a thin-film including an $HfO_2$-based dielectric material. The thin-film including the $HfO_2$-based dielectric material may have ferroelectricity according to the crystalline phase thereof. In addition, the ferroelectric layer 41 may include a material in which an $HfO_2$-based dielectric material is doped with impurities. The impurities may include at least one of Si, Al, Y, La, Gd, Sr, Hf, Ce, and Zr. However, the impurities are not limited thereto and may include an impurity other than the impurities listed above.

The ferroelectric layer 41 may include, for example, $Hf_xZr_{(1-x)}O$ (0<x<1). However, the ferroelectric layer 40 is not limited thereto and may include at least one selected from the group consisting of HfO, ZrO, SiO, AlO, CeO, YO, LaO, and a perovskite compound. Further, the ferroelectric layer 40 may include a material in which at least one of HfO, ZrO, SiO, AlO, CeO, YO, LaO, and a perovskite compound is doped with impurities such as Si, Al, Y, La, Gd, Sr, Hf, Ce, and Zr. However, the impurities are not limited thereto and may include an impurity other than the impurities listed above.

The first gate electrode 53 and the second gate electrode 54 may have an all-around shape surrounding the channel layer 20*i*. For example, the first gate electrode 53 may be formed to surround an outer peripheral surface including upper and lower surfaces of the paraelectric layer 31 surrounding the first area a1 of the channel layer 20*i*. In addition, the second gate electrode 54 may be formed to surround an outer peripheral surface including upper and lower surfaces of the ferroelectric layer 41 surrounding the second area a2 of the channel layer 20*i*.

The insulating layer 62 provided between the first gate electrode 53 and the second gate electrode 54 may have an all-around shape surrounding the channel layer 20*i*. For example, the insulating layer 62 may be formed to surround an outer peripheral surface on a boundary line of the paraelectric layer 31 and the ferroelectric layer 41 surrounding the channel layer 20*i*.

The insulating layer 62 may include an insulating material, such as $SiO_2$. However, the insulating material is not limited thereto, and the insulating layer 62 may include an insulating material of various types other than $SiO_2$.

In addition, the semiconductor element 130 may further include a first passivation layer 63, which is provided above the drain electrode 71, the p-type semiconductor layer 20*p*, the n-type semiconductor layer 20*n*, and the source electrode 72 and surrounds side surfaces of the paraelectric layer 31, the ferroelectric layer 41, the first gate electrode 53, and the second gate electrode 54. Further, the semiconductor element 130 may further include a second passivation layer 64, which is provided below the drain electrode 71, the p-type semiconductor layer 20*p*, the n-type semiconductor layer 20*n*, and the source electrode 72 and surrounds side surfaces of the paraelectric layer 31, the ferroelectric layer 41, the first gate electrode 53, and the second gate electrode 54. The first passivation layer 63 and the second passivation layer 64 may have independent structures separated from each other, or alternatively, may have an all-around shape, similar to the paraelectric layer 31, the ferroelectric layer 41, the first gate electrode 53, the second gate electrode 54, and the insulating layer 62.

Each of the first and second passivation layers 63 and 64 may include an insulating material, such as a silicon oxide. However, the insulating material is not limited thereto, and the first and second passivation layers 63 and 64 may include an insulating material of various types other than or in addition to a silicon oxide.

Figure 10:
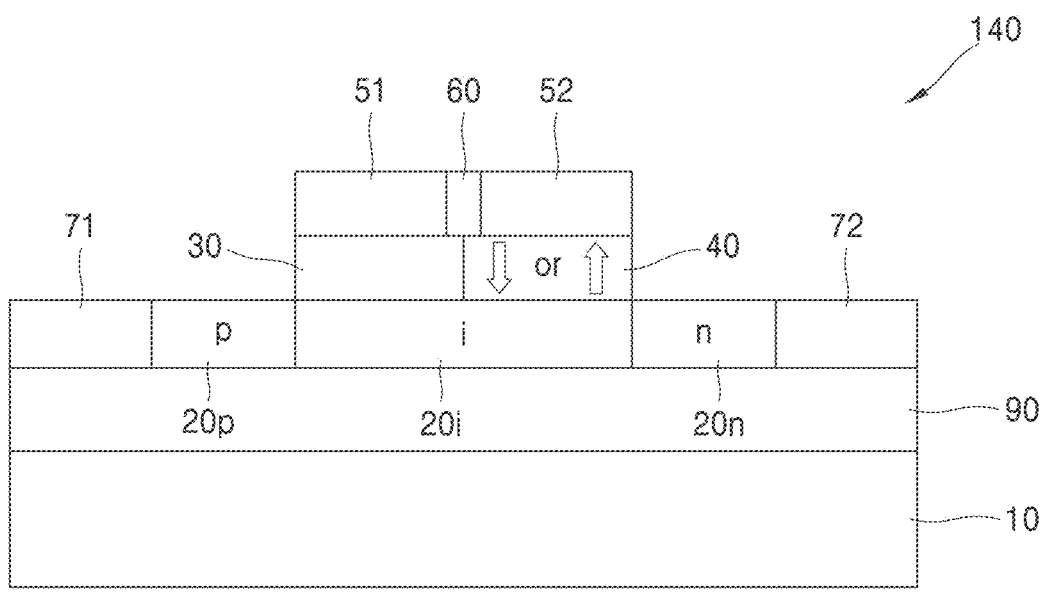
FIG. 10 is a view schematically illustrating an example structure of a semiconductor element according to another embodiment.

FIG. 10 is a view schematically illustrating an example structure of a semiconductor element 140 according to various example embodiments.

The semiconductor element 140 of FIG. 10 may be substantially the same as the semiconductor element 100 of FIG. 1 except that the semiconductor element 140 of FIG. 10 further includes a second insulating layer 90. In the following description of FIG. 10, the same elements as those described with reference to FIGS. 1 to 6 are omitted.

The semiconductor element 140 may further include the second insulating layer 90 between the substrate 10 and the p-type semiconductor layer 20*p*, the channel layer 20*i*, and the n-type semiconductor layer 20*n*. The second insulating layer 90 may be provided on a lower surface of the p-type semiconductor layer 20*p*, the channel layer 20*i*, and the n-type semiconductor layer 20*n*. Accordingly, the semiconductor element 140 may include a structure in which the channel layer 20*i* including a semiconductor material is provided on the second insulating layer 90 including an insulating material. For example, the channel layer 20*i* may include Si, and the second insulating layer 90 may include $SiO_2$. In this case, the semiconductor element 140 may include a silicon on insulator (SOI) substrate structure.

Figures 11, 12:
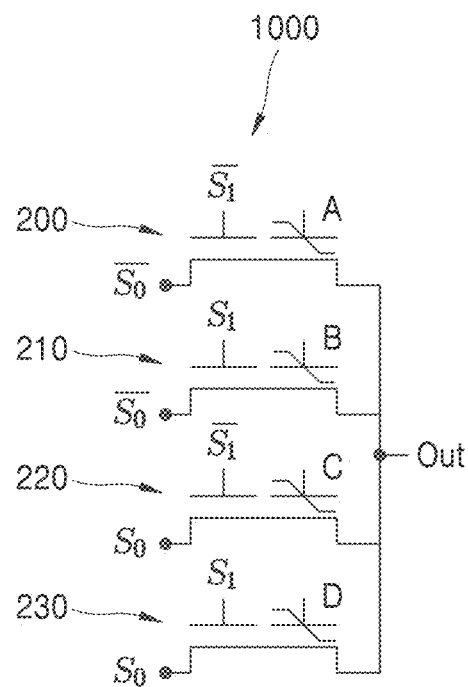
FIG. 11 is a circuit diagram briefly illustrating an example structure of a multiplexer according to an embodiment.
FIG. 12 is a table showing outputs according to control inputs applied to the multiplexer of FIG. 11.

FIG. 11 is a circuit diagram briefly illustrating an example structure of a multiplexer 1000 according to various example embodiments. FIG. 12 is a table showing outputs according to control inputs applied to the multiplexer 1000 of FIG. 11.

Referring to FIG. 11, the multiplexer 1000 may include a plurality of semiconductor elements 200, 210, 220, and 230, which are connected in parallel to each other. The plurality of semiconductor elements 200, 210, 220, and 230 may include any of the semiconductor elements 100, 110, 120, 130, and 140 according to the various embodiments described with reference to FIGS. 1 to 10.

A p-type semiconductor layer included in each of the plurality of semiconductor elements 200, 210, 220, and 230 may operate as a plurality of first input terminals of the multiplexer 1000. In addition, first gate electrodes respectively included in each of the plurality of semiconductor elements 200, 210, 220, and 230 may operate as a plurality of second input terminals of the multiplexer 1000.

For example, a first input voltage, for example, first control inputs $S_0$ or $S_0$ bar or complement, may be applied to the p-type semiconductor layers respectively included in the plurality of semiconductor elements 200, 210, 220, and 230, the p-type semiconductor layers being the plurality of input terminals of the multiplexer 1000. In addition, a second input voltage, for example, second control inputs $S_1$ or $S_1$ bar or complement, may be applied to the first gate electrodes respectively included in the plurality of semiconductor elements 200, 210, 220, and 230, the first gate electrodes being a plurality of second input terminals of the multiplexer 1000. Here, the first and second control inputs $S_0$ and $S_1$ may be positive voltages or voltages of 0 V. When the first and second control inputs $S_0$ and $S_1$ are positive voltages, the first and second control inputs $S_0$ and $S_1$ may be expressed as "1," and when the first and second control inputs $S_0$ and $S_1$ are voltages of 0 V, the first and second control inputs $S_0$ and $S_1$ may be expressed as "0."

N-type semiconductor layers respectively included in the plurality of semiconductor elements 200, 210, 220, and 230 may be connected in parallel to each other. The n-type semiconductors, which are respectively included in the plurality of semiconductor elements 200, 210, 220, and 230 and connected in parallel to each other, may operate as a single output terminal of the multiplexer 1000.

A polarization state of each of ferroelectric layers respectively included in the plurality of semiconductor elements 200, 210, 220, and 230 may be up polarization or down-polarization. For example, polarization states of at least two of the plurality of semiconductor elements 200, 210, 220, and 230 may be up polarization or down-polarization, which are different from each other.

Meanwhile, the multiplexer 1000 may further include at least one inverter connected to any of the plurality of semiconductor elements 200, 210, 220, and 230. For example, the at least one inverter may be electrically connected to a p-type semiconductor layer and/or first gate electrode of the any of the plurality of semiconductor elements 200, 210, 220, and 230.

In this case, when the first control input $S_0$ and the second control input $S_1$ are respectively applied to the p-type semiconductor layer and the first gate electrode included in each of the plurality of semiconductor elements 200, 210, 220, and 230, an arrangement of the at least one inverter and the polarization state of the ferroelectric layer included in each of the plurality of semiconductor elements 200, 210, 220, and 230 may be determined so that the multiplexer 1000 operates as any of (e.g. exactly one of) an AND gate, an OR gate, a NAND gate, and a NOR gate.

For example, the plurality of semiconductor elements 200, 210, 220, and 230 may include four semiconductor elements including the first semiconductor element 200, the second semiconductor element 210, the third semiconductor element 220, and the fourth semiconductor element 230, which are connected in parallel to each other. In this case each of a p-type semiconductor layer and a first gate electrode of the first semiconductor element 200 may be connected to the inverter. A p-type semiconductor layer of the second semiconductor element 210 may be connected to the inverter, but a first gate electrode of the second semiconductor element 210 may not be connected to the inverter. A p-type semiconductor layer of the third semiconductor element 220 may not be connected to the inverter, but a first gate electrode of the third semiconductor element 220 may be connected to the inverter. A p-type semiconductor layer and first gate electrode of the fourth semiconductor element 230 may not be connected to the inverter.

The reverse forms of the control inputs $S_0$ and $S_1$, $S_0$ bar and $S_1$ bar, may be respectively applied to the p-type semiconductor layer and first gate electrode of the first semiconductor element 200, which are connected to the inverter. The p-type semiconductor layer of the second semiconductor element 210, which is connected to the inverter, and the first gate electrode of the second semiconductor element 210, which is not connected to the inverter, may receive the control inputs $S_0$ and $S_1$ in the form of $S_0$ bar and $S_1$. The p-type semiconductor layer of the third semiconductor element 220, which is not connected to the inverter, and the first gate electrode of the third semiconductor element 220, which is connected to the inverter, may receive the control inputs $S_0$ and $S_1$ in the form of $S_0$ and $S_1$ bar. The p-type semiconductor layer and first gate electrode of the fourth semiconductor element 230, which are not connected to the inverter, may receive the control inputs $S_0$ and $S_1$ in an unreversed form, that is, $S_0$ and $S_1$.

In addition, a polarization state of a first ferroelectric layer of the first semiconductor element 200 may be A, a polarization state of a second ferroelectric layer of the second semiconductor element 210 may be B, a polarization state of a third ferroelectric layer of the third semiconductor element 220 may be C, and a polarization state of a fourth ferroelectric layer of the fourth semiconductor element 230 may be D. A polarization state in which the first to fourth ferroelectric layers may have may be up polarization or down polarization, and up polarization may be expressed as "0," and down polarization may be expressed as "1."

When the control inputs $S_0$ and $S_1$ applied to the multiplexer 1000 are (0, 0), a positive voltage may be applied to both the p-type semiconductor layer and first gate electrode of the first semiconductor element 200, a positive voltage may be applied to the p-type semiconductor layer of the second semiconductor element 210 and a voltage of 0 V may be applied to the first gate electrode of the second semiconductor element 210, a voltage of 0 V may be applied to the p-type semiconductor layer of the third semiconductor element 220 and a positive voltage may be applied to the first gate electrode of the third semiconductor element 220, and a voltage of 0 V may be applied to both the p-type semiconductor layer and first gate electrode of the fourth semiconductor element 230. In this case, because a polarization state may be output only from the first semiconductor element 200 of which both the p-type semiconductor and the first gate electrode receive a positive voltage, when the control inputs $S_0$ and $S_1$ applied to the multiplexer 1000 are (0,0), as shown in FIG. 12, information about "A," which is a polarization state of the first ferroelectric layer of the first semiconductor element 200, may be output.

When the control inputs $S_0$ and $S_1$ applied to the multiplexer 1000 are (0,1), a positive voltage may be applied to the p-type semiconductor layer of the first semiconductor element 200 and a voltage of 0 V may be applied to the first gate electrode of the first semiconductor element 200, a positive voltage may be applied to both the p-type semiconductor layer and first gate electrode of the third semiconductor element 220, and a voltage of 0 V may be applied to the p-type semiconductor layer of the fourth semiconductor element 230 and a positive voltage may be applied to the first gate electrode of the fourth semiconductor element 230. In this case, because a polarization state may be output only from the second semiconductor element 210, of which both the p-type semiconductor and the first gate electrode receive a positive voltage, when the control inputs $S_0$ and $S_1$ applied to the multiplexer 1000 are (0,1), as shown in FIG. 12, information about "B," which is a polarization state of the second ferroelectric layer of the second semiconductor element 210, may be output.

When the control inputs $S_0$ and $S_1$ applied to the multiplexer 1000 are (1,0), a voltage of 0 V may be applied to the p-type semiconductor layer of the first semiconductor element 200 and a positive voltage may be applied to the first gate electrode of the first semiconductor element 200, a voltage of 0 V may be applied to both the p-type semiconductor layer and first gate electrode of the third semiconductor element 220, and a positive voltage may be applied to the p-type semiconductor layer of the fourth semiconductor element 230 and a voltage of 0 V may be applied to the first gate electrode of the fourth semiconductor element 230. In this case, because a polarization state may be output only from the third semiconductor element 220 of which both the p-type semiconductor and the first gate electrode receive a positive voltage, when the control inputs $S_0$ and $S_1$ applied to the multiplexer 1000 are (1,0), as shown in FIG. 12, information about "C," which is a polarization state of the third ferroelectric layer of the third semiconductor element 220, may be output.

When the control inputs $S_0$ and $S_1$ applied to the multiplexer 1000 are (1,1), a voltage of 0 V may be applied to both the p-type semiconductor layer and first gate electrode of the first semiconductor element 200, a voltage of 0 V may be applied to the p-type semiconductor layer of the second semiconductor element 210 and a positive voltage may be applied to the first gate electrode of the second semiconductor element 210, a positive voltage may be applied to the p-type semiconductor layer of the third semiconductor element 220 and a positive voltage may be applied to the first gate electrode of the third semiconductor element 220, and a positive voltage may be applied to both the p-type semiconductor layer and first gate electrode of the fourth semiconductor element 230. In this case, because a polarization state may be output only from the fourth semiconductor element 230, of which both the p-type semiconductor and the first gate electrode receive a positive voltage, when the control inputs $S_0$ and $S_1$ applied to the multiplexer 1000 are (1,1), as shown in FIG. 12, information about "D," which is a polarization state of the fourth ferroelectric layer of the fourth semiconductor element 230, may be output.

In this case, by appropriately adjusting the polarization states A, B, C, and D of the first to fourth ferroelectric layers of the first to fourth semiconductor elements 200, 210, 220, and 230, the multiplexer 1000 may operate as any of an AND gate, an OR gate, a NAND gate, and a NOR gate.

For example, when A is formed to have down polarization, and B, C, and D are formed to have up polarization, outputs for the control inputs $S_0$ and $S_1$, (0,0), (0,1), (1,0), and (1,1), of the table of FIG. 12 may be (1,0,0,0), and accordingly, the multiplexer 1000 may operate as a NOR gate.

For example, when A, B, C are formed to have up polarizations, and D is formed to have down polarizations, outputs for the control inputs $S_0$ and $S_1$, (0,0), (0,1), (1,0), and (1,1), of the table of FIG. 12 may be (0,0,0,1), and accordingly, the multiplexer 1000 may operate as an AND gate.

For example, when A is formed to have up polarization, and B, C, and D are formed to have down polarization, outputs for the control inputs $S_0$ and $S_1$, (0,0), (0,1), (1,0), and (1,1), of the table of FIG. 12 may be (1,0,0,0), and accordingly, the multiplexer 1000 may operate as an OR gate.

For example, when all of A, B, C are formed to have down polarization, and D is formed to have up polarization, outputs for the control inputs $S_0$ and $S_1$, (0,0), (0,1), (1,0), and (1,1), of the table of FIG. 12 may be (1,1,1,0), and accordingly, the multiplexer 1000 may operate as a NAND gate.

Figure 13:
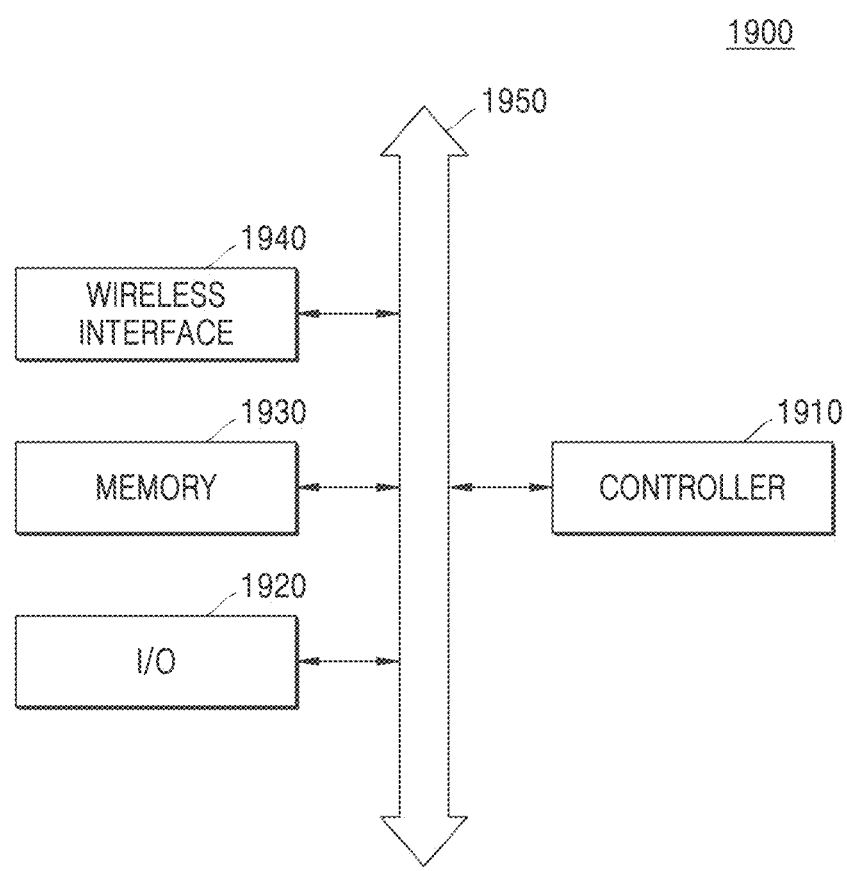
FIG. 13 is a block diagram is a block diagram illustrating an electronic system 1900 according to some example embodiments.

FIG. 13 is a block diagram illustrating an electronic system 1900 as a third electronic apparatus according to some example embodiments.

Referring to FIG. 13, the electronic system 1900 may configure a wireless communication device, or an apparatus capable of transmitting and/or receiving information under a wireless environment. The electronic system 1900 includes a controller 1910, an input/output device (I/O) 1920, a memory 1930, and a wireless interface 1940 which are interconnected through a bus 1950, respectively.

The controller 1910 may include at least one of a microprocessor, a digital signal processor, or a processing device similar thereto. The input/output device 1920 may include at least one of a keypad, a keyboard, and a display.

The memory 1930 may be used to store commands executed by the controller 1910. For example, the memory 1930 may be used to store user data. In some examples, the memory 1930 may include a magnetic memory device according to various example embodiments.

The electronic system 1900 may use the wireless interface 1940 to transmit/receive data through a wireless communication network. The wireless interface 1940 may include an antenna and/or a wireless transceiver. In some example embodiments, the electronic system 1900 may be used in a third generation communication system, e.g., a communication interface protocol of the third generation communication system, such as code division multiple access (CDMA), global system for mobile communications (GSM), north American digital cellular (NADC), extended-time division multiple access (E-TDMA), and/or wideband code division multiple access (WCDMA).

Any or all of the components included in the electronic system 1900 illustrated in FIG. 13 may include at least one semiconductor element, such as at least one of semiconductor elements 100, 110, 120, 130, and 140 described with reference to FIGS. 1 to 10. Furthermore, any or all of the components included in the electronic system 1900 illustrated in FIG. 13 may include at least one multiplexer 1000 illustrated above with reference to FIGS. 1-10. For example, at least one component illustrated in the electronic system 1900 may include at least one semiconductor chip that includes at least one multiplexer 1000. At least one component illustrated in the electronic system 1900 may include at least one of semiconductor elements 100, 110, 120, 130, and 140 described with reference to FIGS. 1 to 10.

As described above, the multiplexer 1000 may operate as a 4-to-1 MUX that operates so that any of four inputs, A, B, C, and D, is output. Similar to the multiplexer 1000 of FIG. 11, a MUX of various types, such as an 8-to-1 MUX, may be designed by appropriately arranging the semiconductor elements 100, 110, 120, 130, and 140 described with reference to FIGS. 1 to 10.

According to the various example embodiments, a multiplexer including a semiconductor element having a ferroelectric layer with a polarization state, the multiplexer thus exhibiting an improved data processing rate and/or being reconfigurable as various logic circuits.

According to the various embodiments, a multiplexer having a structure in which a memory element including bit information and a control input terminal configured to receive a control input from the outside are embedded by including a ferroelectric layer having a polarization state and a semiconductor having a PIN structure may be provided, and accordingly, the multiplexer may be miniaturized or reduced in size.

According to the various embodiments of various example embodiments, a multiplexer with reduced power consumption by including a non-volatile ferroelectric layer that does not require a driving voltage may be provided.

It should be understood that various example embodiments described herein should be considered in a descriptive sense only and not for purposes of limitation. Descriptions of features or aspects within each example embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor element comprising:
   a channel layer comprising a semiconductor material;
   a p-type semiconductor layer and an n-type semiconductor layer, which are apart from each other with the channel layer between the p-type semiconductor layer and the n-type semiconductor layer;
   a paraelectric layer on a first area of the channel layer;
   a ferroelectric layer on a second area different from the first area of the channel layer, and configured to have a polarization state in response to a voltage applied from an external source, the paraelectric layer in contact with the ferroelectric layer;
   a first gate electrode on the paraelectric layer;
   a second gate electrode on the ferroelectric layer; and
   an insulating layer between the first gate electrode and the second gate electrode, and electrically separating the first gate electrode and the second gate electrode from each other.

2. The semiconductor element of claim 1, wherein the first area includes an area relatively closer to the p-type semiconductor layer with respect to a center of the channel layer, and the second area includes an area relatively closer to the n-type semiconductor layer with respect to the center of the channel layer.

3. The semiconductor element of claim 1, wherein the channel layer includes an intrinsic semiconductor material.

4. The semiconductor element of claim 1, wherein the polarization state is one of an up-polarization or a down-polarization.

5. The semiconductor element of claim 1, further comprising:
   a drain electrode configured to be electrically connected to the p-type semiconductor layer; and
   a source electrode configured to be electrically connected to the n-type semiconductor layer.

6. The semiconductor element of claim 1, wherein the ferroelectric layer includes a material in which at least one of an oxide including at least one of hafnium (Hf) and zirconium (Zr) or an oxide including any one from among Hf and Zr is doped with at least one impurity from among silicon (Si), aluminum (Al), yttrium (Y), lanthanum (La), gadolinium (Gd), strontium (Sr), Hf, cerium (Ce), and Zr.

7. The semiconductor element of claim 1, wherein the paraelectric layer includes at least one of a silicon oxide, a silicon nitride, a silicon oxynitride, a metal oxide, a metal oxynitride, and a silicate.

8. The semiconductor element of claim 1, further comprising:
   a second paraelectric layer between the ferroelectric layer and the channel layer.

9. The semiconductor element of claim 1, wherein the paraelectric layer and the ferroelectric layer each have an all-around shape surrounding the channel layer.

10. The semiconductor element of claim 1, wherein the first gate electrode and the second gate electrode each have an all-around shape surrounding the channel layer.

11. The semiconductor element of claim 1, further comprising:
    a substrate below the p-type semiconductor layer, the channel layer, and the n-type semiconductor layer.

12. The semiconductor element of claim 11, further comprising:
    a second insulating layer between the substrate and the p-type semiconductor layer, the channel layer, and the n-type semiconductor layer.

13. The semiconductor element of claim 1, wherein each of the first gate electrode and the second gate electrode includes one or more of a metal, a metal nitride, a polysilicon, and a two-dimensional material.

14. The semiconductor element of claim 1, wherein the channel layer includes one or more of Si, germanium (Ge), Group III-V semiconductor, oxide semiconductor, nitride semiconductor, nitrogen oxide semiconductor, and a two-dimensional material.

15. A multiplexer comprising a plurality of semiconductor elements connected in parallel to each other, wherein each of the plurality of semiconductor elements comprises:
    a channel layer including a semiconductor material;
    a p-type semiconductor layer and a n-type semiconductor layer that are provided to be apart from each other with the channel layer between the p-type semiconductor layer and the n-type semiconductor layer;
    a paraelectric layer on a first area of the channel layer;
    a ferroelectric layer on a second area that is different from the first area of the channel layer, and configured to have a polarization state according to a voltage applied from an outside;
    a first gate electrode on the paraelectric layer;
    a second gate electrode on the ferroelectric layer; and
    an insulating layer between the first gate electrode and the second gate electrode, and electrically separates the first gate electrode and the second gate electrode from each other, wherein
    the p-type semiconductor layers respectively included in the plurality of semiconductor elements operate as a plurality of first input terminals of the multiplexer,
    the first gate electrodes respectively included in the plurality of semiconductor elements operate as a plurality of second input terminals of the multiplexer, and
    the n-type semiconductor layers respectively included in the plurality of semiconductor elements are connected in parallel to each other, and operate as a single output terminal of the multiplexer.

16. The multiplexer of claim 15, wherein polarization states of ferroelectric layers of at least two of the plurality of semiconductor elements are up polarization and down polarization, which are different from each other.

17. The multiplexer of claim 15, further comprising:
    at least one inverter connected to at least one of the plurality of semiconductor elements.

18. The multiplexer of claim 17, wherein, in response to a first input voltage and a second input voltage being respectively applied to the p-type semiconductor layer and first gate electrode included in each of the plurality of semiconductor elements, an arrangement of the at least one inverter and polarization states of ferroelectric layers respectively included in the plurality of semiconductor elements are determined so that the multiplexer operates as any of an AND gate, an OR gate, a NAND gate, and a NOR gate.

19. The multiplexer of claim 17, wherein the plurality of semiconductor elements comprise four semiconductor elements of a first semiconductor element, a second semiconductor element, a third semiconductor element, and a fourth semiconductor element, which are connected in parallel to each other,
- a p-type semiconductor layer and first gate electrode of the first semiconductor element are connected to the at least one inverter,
- in response to a p-type semiconductor layer of the second semiconductor element being connected to the at least one inverter, a first gate electrode of the second semiconductor element is not connected to the at least one inverter,
- in response to a p-type semiconductor layer of the third semiconductor element not connected to the at least one inverter, a first gate electrode of the third semiconductor element is connected to the at least one inverter, and
- a p-type semiconductor layer and first gate electrode of the fourth semiconductor element are connected to the at least one inverter.

20. The multiplexer of claim 19, wherein a polarization state of a first ferroelectric layer included in the first semiconductor element is down-polarization, and polarization states of second to fourth ferroelectric layers respectively included in the second to fourth semiconductor elements are up-polarization.

21. The multiplexer of claim 19, wherein polarization states of first to third ferroelectric layers respectively included in the first to third semiconductor elements are up-polarization, and a polarization state of a fourth ferroelectric layer included in the fourth semiconductor element is down-polarization.

22. The multiplexer of claim 19, wherein a polarization state of a first ferroelectric layer included in the first semiconductor element is up-polarization, and polarization states of second to fourth ferroelectric layers respectively included in the second to fourth semiconductor elements are down-polarization.

23. The multiplexer of claim 19, wherein polarization states of first to third ferroelectric layers respectively included in the first to third semiconductor elements are down-polarization, and a polarization state of a fourth ferroelectric layer included in the fourth semiconductor element is up-polarization.

* * * * *